US011177640B2

(12) United States Patent
Chen et al.

(10) Patent No.: US 11,177,640 B2
(45) Date of Patent: Nov. 16, 2021

(54) CABLE MANAGEMENT ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 91 days.

(21) Appl. No.: 16/591,633

(22) Filed: Oct. 3, 2019

(65) Prior Publication Data
US 2020/0412118 A1    Dec. 31, 2020

(30) Foreign Application Priority Data
Jun. 25, 2019 (TW) ................. 108122505

(51) Int. Cl.
  *F16L 3/00* (2006.01)
  *H02G 3/32* (2006.01)
  *H05K 7/14* (2006.01)

(52) U.S. Cl.
  CPC ............. *H02G 3/32* (2013.01); *H05K 7/1491* (2013.01)

(58) Field of Classification Search
None
See application file for complete search history.

(56) References Cited

U.S. PATENT DOCUMENTS

| | | | |
|---|---|---|---|
| 8,186,634 B2 | 5/2012 | Chen | |
| 9,072,190 B2 | 6/2015 | Chen | |
| 9,072,194 B2 | 6/2015 | Chen | |
| 9,144,174 B2 | 9/2015 | Chen | |
| 9,167,717 B2 | 10/2015 | Chen | |
| 9,383,038 B2 | 7/2016 | Chen | |
| 10,292,301 B1 | 5/2019 | Chen | |
| 10,389,100 B2 | 8/2019 | Chen | |
| 2006/0081736 A1 | 4/2006 | Chen | |
| 2009/0014601 A1* | 1/2009 | Chen | H05K 7/1491 248/70 |
| 2013/0077219 A1 | 3/2013 | Fu | |
| 2014/0158646 A1* | 6/2014 | Chen | H05K 7/1491 211/26 |
| 2014/0158834 A1* | 6/2014 | Chen | H05K 7/1421 248/68.1 |
| 2014/0183306 A1* | 7/2014 | Chen | H05K 7/1491 248/70 |
| 2016/0161026 A1* | 6/2016 | Chen | H05K 7/1491 248/70 |
| 2016/0215904 A1* | 7/2016 | Chen | H02G 3/32 |
| 2018/0049341 A1* | 2/2018 | Chen | H02G 3/32 |

* cited by examiner

Primary Examiner — Steven M Marsh
(74) Attorney, Agent, or Firm — Winston Hsu

(57) ABSTRACT

A cable management assembly includes a cable management device and a supporting device. Two engaging members are arranged on one of the cable management device and the supporting device. A mounting member is arranged on the other one of the cable management device and the supporting device. The mounting member is detachably connected to one of the two engaging members.

18 Claims, 7 Drawing Sheets

CABLE MANAGEMENT ASSEMBLY

BACKGROUND OF THE INVENTION

1. Field of the Invention

The present invention relates to a cable management assembly, and more particularly, to a cable management assembly for a slide rail.

2. Description of the Prior Art

U.S. Pat. No. 8,186,634 B2 of Chen et al. disclose a cable management arm supporting device including a supporting frame and a cable management arm which can be folded and unfolded. The supporting frame is stretchable and retractable and configured to support the cable management arm. Wherein, the cable management arm and the supporting frame are not connected and are two separated components. However, according to above arrangement, the mounting direction of the cable management arm and the supporting frame is limited by the specification, such that the corresponding slide rail of the cable management arm and the supporting frame is not interchangeable between the right slide rail and the left slide rail.

U.S. Pat. No. 9,072,190 B2 disclose a cable management arm including two cable managing arms being pivoted to each other through a frame. Wherein, the two cable managing arms are respectively connected to a fix rail and a movable rail of a first slide rail assembly through a first connecting member and a second connecting member respectively. On the other hand, a supporting device (such as two supporting members which are stretchable and retractable relative to each other) supports bottom of the two cable managing arms through the frame. Furthermore, the supporting device is pivoted to bottom of the two cable managing arms through a sliding block. In other words, the cable management arm is not detachable from the supporting device except in a destructive manner. Although the arrangement of the cable management arm can interchange the corresponding slide rail between the right slide rail and the left slide rail, the specifications of the supporting device and the cable management arm have to be consistently flat within a certain range. If the cable managing arm is in the form of a curved extended arm, the availability of space will be compressed in a specific position behind the chassis by interchanging the corresponding slide rail between the right slide rail and the left slide rail. There may be even interference between the cable management arm and some components behind the chassis.

Therefore, for different requirements of market, changing the connecting manner between the supporting device and the cable management arm may improve the utilizable efficiency of the cable management product.

SUMMARY OF THE INVENTION

The present invention provides a cable management device having improved utilizable efficiency.

According to an embodiment of the present invention, a cable management assembly includes a cable management device and a supporting device. The supporting device is detachably connected to the cable management device.

Preferably, one of the cable management device and the supporting device includes two engaging members, the other one of the cable management device and the supporting device includes a mounting member, the mounting member is configured to be detachably connected to one of the two engaging members.

Preferably, one of the two engaging members and the mounting member are engaged with each other through an elastic portion in a first state.

Preferably, when the elastic portion is applied to a force to be changed from the first state to a second state, the mounting member is able to be disengaged from one of the two engaging members.

Preferably, the cable management device includes a first arm, a second arm and a connecting member, the connecting member includes a first connecting portion and a second connecting portion, the first connecting portion and the second connecting portion are configured to movably mounted on a first end portion of the first arm and a first end portion of the second arm respectively.

Preferably, the first connecting portion and the second connecting portion of the connecting member are respectively pivoted to the first end portion of the first arm and the first end portion of the second arm.

Preferably, the connecting member of the cable management device further includes an intermediate portion located between the first connecting portion and the second connection portion, the two engaging members are respectively arranged on two positions of the intermediate portion.

Preferably, the supporting device includes at least one supporting rod, the mounting member is arranged on the at least one supporting rod.

Preferably, at least one cable management feature is arranged on one of the first arm, the second arm and the connecting member.

Preferably, a contour shape of the first arm and a contour shape of the second arm are different.

Preferably, a first auxiliary member and a second auxiliary member are respectively arranged on a second end portion of the first arm and a second end portion of the second arm, the first auxiliary member and the second auxiliary member are configured to mount the cable management device to a first object and a second object respectively.

Preferably, the first auxiliary member and the second auxiliary member are respectively pivoted to the second end portion of the first arm and the second end portion of the second arm.

Preferably, the mounting member is arranged on the at least one supporting rod, a third auxiliary member is arranged adjacent to an end portion of the at least one supporting rod, the third auxiliary member is configured to mount the supporting device to a third object.

Preferably, the third auxiliary member is pivoted to the end portion of the at least one supporting rod.

According to another embodiment of the present invention, a cable management assembly is applicable to a first slide rail assembly and a second slide rail assembly. The first slide rail assembly and the second slide rail assembly respectively include a first rail and a second rail. The second rail is movable relative to the first rail. The cable management assembly includes a cable management device, a first auxiliary member, a second auxiliary member, a supporting device, a third auxiliary member and two engaging members. The cable management device includes a first arm, a second arm and a connecting member. Wherein, the first arm and the second arm have a first end portion and a second end portion respectively. The connecting member includes a first connecting portion and a second connecting portion. The first connecting portion and the second connecting portion are respectively pivoted to a first end portion of the first arm and a first end portion of the second arm. The first auxiliary member and a second auxiliary member are respectively arranged on a second end portion of the first arm and a second end portion of the second arm. The first auxiliary member and the second auxiliary member are configured to respectively mount the cable management device to the first rail and the second rail of one of the first slide rail assembly and the second slide rail assembly. The supporting device is detachably connected to the cable management device. The supporting device includes at least one supporting rod. The third auxiliary member is arranged on the at least one supporting rod. The third auxiliary member is configured to mount the supporting device to the first rail of the other one of the first slide rail assembly and the second rail assembly. Two engaging members are arranged on one of the cable management device and the supporting device. The mounting member is arranged on the other one of the cable management device and the supporting device. The mounting member is configured to be detachably connected to one of the two engaging members.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
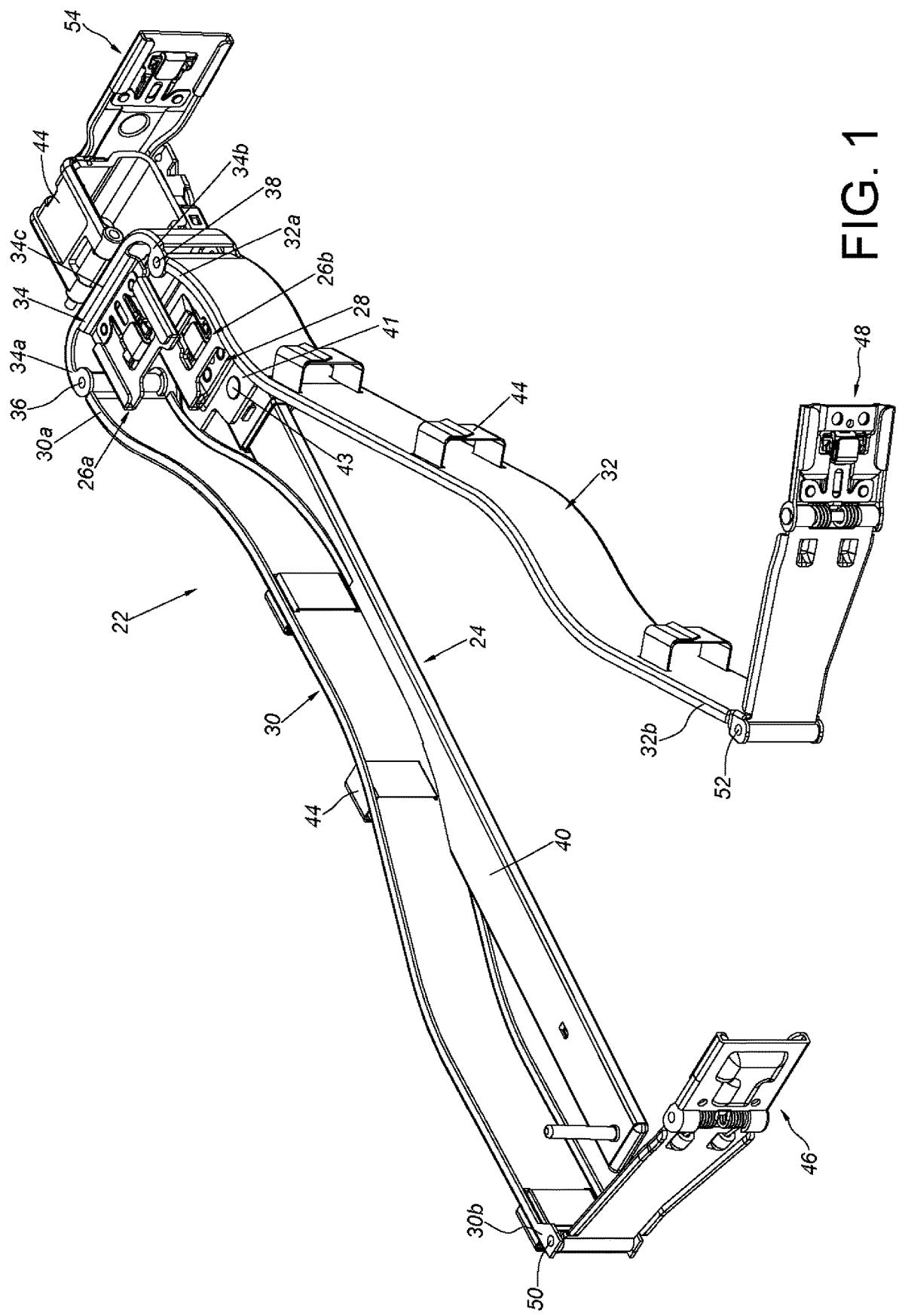
FIG. 1 is a schematic diagram illustrating a cable management assembly according to an embodiment of the present invention.
Figure 2:
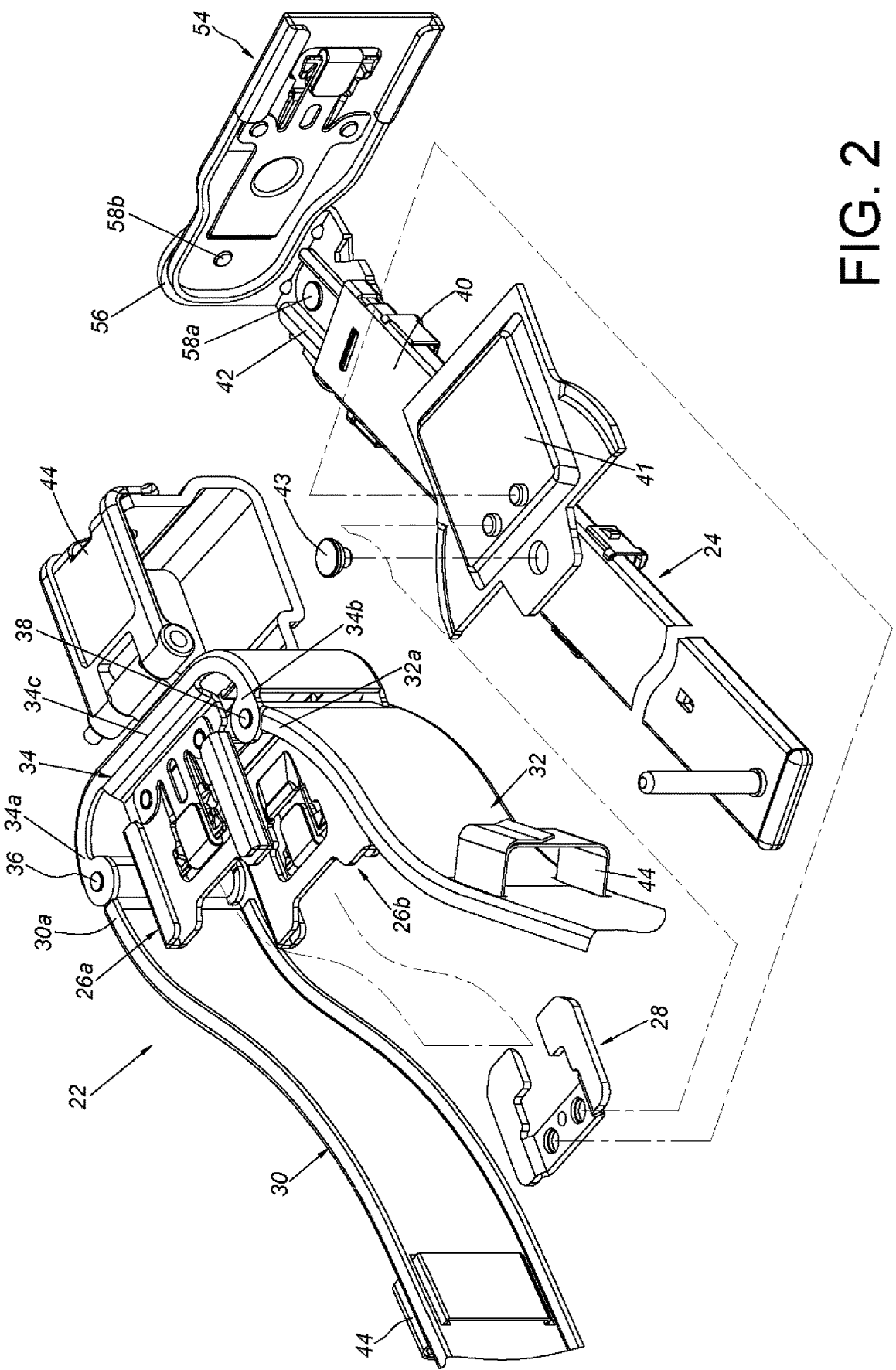
FIG. 2 is an exploded view illustrating the cable management assembly according to the embodiment of the present invention.

As shown in FIG. 1 and FIG. 2, a cable management assembly according to an embodiment of the present invention includes a cable management device 22 and a supporting device 24. The supporting device 24 is detachably connected to the cable management device 22.

Specifically, one of the cable management device 22 and the supporting device 24 includes two engaging members (e.g. a first engaging member 26a and a second engaging member 26b). On the other hand, the other one of the cable management device 22 and the supporting device 24 includes a mounting member 28 configured to be connected to one of the first engaging member 26a and the second engaging member 26b. In the present embodiment, the cable management device 22 includes the first engaging member 26a and the second engaging member 26b with substantially the same structural arrangement, and the supporting device 24 includes the mounting member 28, but the present invention is not limited thereto.

Preferably, the cable management device 22 includes a first arm 30, a second arm 32 and a connecting member 34. Wherein, the first arm 30 includes a first end portion 30a and a second end portion 30b. The second arm 32 includes a first end portion 32a and a second end portion 32b. The connecting member 34 includes a first connecting portion 34a and a second connecting portion 34b configured to be movably respectively mounted to the first end portion 30a of the first arm 30 and the first end portion 32a of the second arm 32. In the present embodiment, the first connecting portion 34a and the second connecting portion 34b of the connecting member 34 are respectively pivoted to the first end portion 30a of the first arm 30 and the first end portion 32a of the second arm 32 through a first shaft member 36 and a second shaft member 38 respectively.

Preferably, the connecting member 34 of the cable management device 22 further includes an intermediate portion 34c located between the first connecting portion 34a and the second connecting portion 34b. The first engaging member 26a and the second engaging member 26b are respectively arranged on two positions on the intermediate portion 34c. For example, the first engaging member 26a is arranged on an upper position of the intermediate portion 34c and the second engaging member 26b is arranged on a lower position of the intermediate portion 34c. In the present embodiment, the upper and lower positions are for illustrative explanation to understand the structural arrangement of the embodiment, but the present invention is not limited thereto.

Preferably, the supporting device 24 is configured to support a bottom portion of the cable management device 22. For example, when the supporting device 24 is connected to the second engaging member 26b through the mounting member 28 (as shown in FIG. 1), the supporting device 24 is able to support the bottom portion of the cable management device 22, and the cable management assembly is in a first predetermined state. Alternatively, when the cable management device 22 is rotated 180 degrees (such as upside down) and the supporting device 24 is connected to the first engaging member 26a through the mounting member 28, the supporting device 24 is still able to support the bottom portion of the cable management device 22, and the cable management assembly is in a second predetermined state.

Preferably, the supporting device 24 includes at least one supporting rod. In the present embodiment, the supporting device 24 includes a first supporting rod 40 and a second supporting rod 42. The first supporting rod 40 and the second supporting rod 42 are able to be stretchable and retractable relative to each other. On the other hand, the mounting member 28 is arranged on the at least on supporting rod. For example, the mounting member 28 is connected to a base body 41, and the base body 41 is pivoted to the first supporting rod 40 through a connecting shaft 43.

Preferably, at least one cable management feature 44 is arranged on one of the first arm 30, the second arm 32 and the connecting member 34. In the present embodiment, all of the first arm 30, the second arm 32 and the connecting member 34 have the cable management features 44. The at least one cable management feature 44 can be an additional component attached on the first arm 30, the second arm 32 and the connecting member 34. Alternatively, the at least one cable management feature 44 can be a cord or a cable tie attached on the first arm 30, the second arm 32 and the connecting member 34, but the present invention is not limited thereto. In addition, a contour shape of the first arm 30 and a contour shape of the second arm 32 are different.

Preferably, a first auxiliary member 46 and a second auxiliary member 48 are respectively arranged on the second end portion 30b of the first arm 30 and the second end portion 32b of the second arm 32. The first auxiliary member 46 and the second auxiliary member 48 are configured to respectively mount the cable management device 22 to a first object and a second object. Wherein, the first auxiliary member 46 and the second auxiliary member 48 are respectively pivoted to the second end portion 30b of the first arm 30b and the second end portion 32b of the second arm 32. As shown in FIG. 1, the first auxiliary member 46 is pivoted to the second end portion 30b of the first arm 30 through a third shaft 50, and the second auxiliary member 48 is pivoted to the second end portion 32b of the second arm 32 through a fourth shaft 52.

Preferably, a third auxiliary member 54 is arranged adjacent to an end portion of the second supporting rod 42. The third auxiliary member 54 is configured to mount the supporting device 24 to a third object. Wherein, the third auxiliary member 54 is pivoted to the second supporting rod 42. For example, a L-shaped supporting member 56 is connected adjacent to the end portion of the second supporting rod 42. Specifically, a fifth shaft 58a is pivoted to a horizontal portion of the L-shaped supporting member 56, such that the L-shaped supporting member 56 is rotatable relative to the second supporting rod 42. The third auxiliary member 54 is pivoted to a vertical portion of the L-shaped supporting member 56 through a sixth shaft 58b, such that the third auxiliary member 54 is rotatable relative to the L-shaped supporting member 56.

Figure 3:
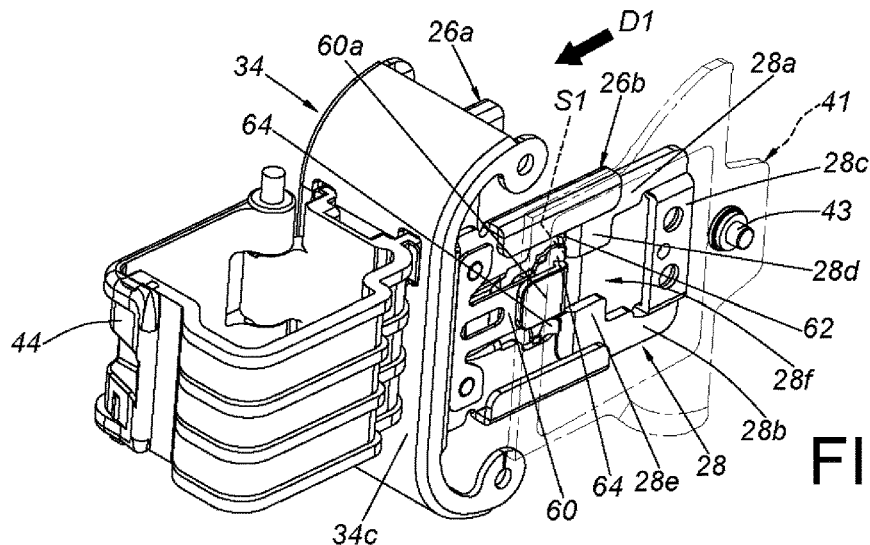
FIG. 3 is a diagram illustrating a mounting process between a mounting member and one of two engaging members according to an embodiment of the present invention.
Figure 4:
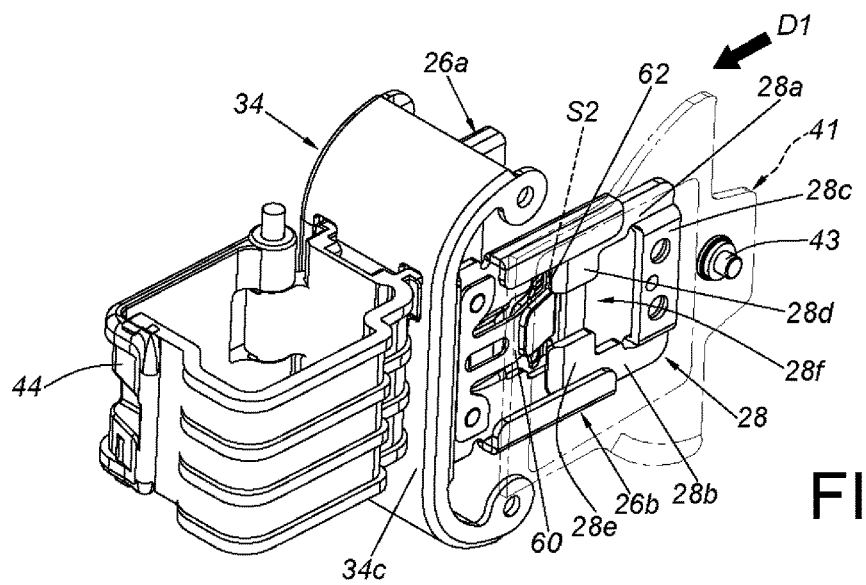
FIG. 4 is a diagram illustrating the mounting process between the mounting member and one of the two engaging members, the mounting member abutting against one of the two engaging members through a guiding section according to an embodiment of the present invention.
Figure 5:
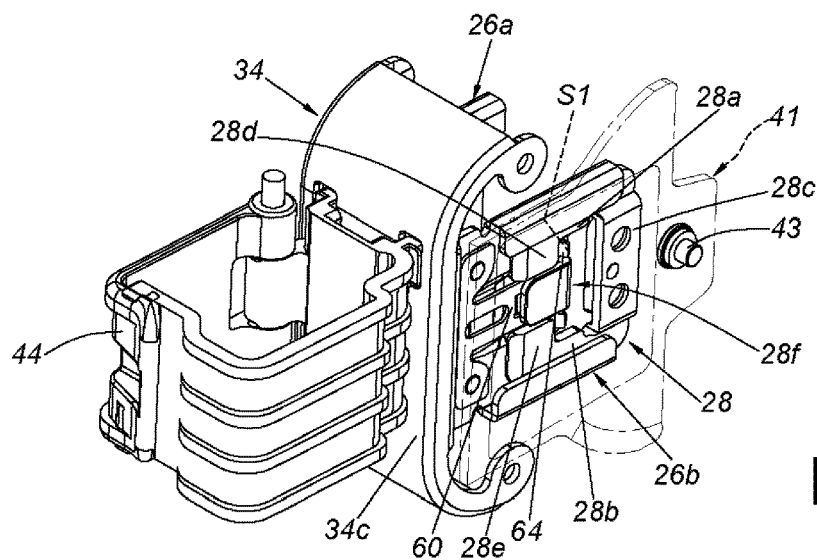
FIG. 5 is a diagram illustrating the mounting member being mounted on one of the two engaging members according to an embodiment of the present invention.

As shown in FIG. 3, FIG. 4 and FIG. 5, the mounting member 28 is configured to be connected to one of the first engaging member 26a and the second engaging member 26b. Wherein, in the present embodiment, the first engaging member 26a and the second engaging member 26b have substantially same structural arrangement. For simplification, only how the mounting member 28 is connected to the second engaging member 26b is illustrated.

Preferably, one of the first engaging member 26a and the second engaging member 26b is engaged with the mounting member 28 through an elastic portion 60 being in a first state S1. In the present embodiment, the first engaging member 26a and the second engaging member 26b both have the elastic portion 60 and one of the mounting member 28 and the elastic portion 60 includes a guiding section 62. Preferably, the guiding section 62 has an inclined surface or an arc surface.

Furthermore, When the mounting member 28 is moved along a mounting direction D1 to be mounted to the elastic portion 60 in the first state S1 of the second engaging member 26b (As shown in FIG. 3) and the mounting member 28 is guided to abuts against the elastic portion 60 of the second engaging member 26b through the guiding section 62, the elastic portion 60 of the second engaging member 26b is deflected by an angle to be not in the first state S1 (such as be in a second state S2, the elastic portion 60 accumulates an elastic force in the second state S2, as shown in FIG. 4) until the mounting member 28 is further moved along the mounting direction D1 to a mounting position (as shown in FIG. 5). The elastic portion 60 releases the elastic force and is in the first state S1 again. The elastic portion 60 is engaged with the mounting member 28 through an engaging section 64 of the elastic portion 60, such that the mounting member 28 is connected to the second engaging member 26b. As shown in FIG. 3 to FIG. 5, the mounting member 28 includes a first mounting arm 28a, a second mounting arm 28b, a secure portion 28c, a first fixing portion 28d and a second fixing portion 28e. An end of the first mounting arm 28a and an end of the second mounting arm 28b are connected to opposite ends of the secure portion 28c. The first fixing portion 28d is connected to another end of the first mounting arm 28a. The second fixing portion 28e is connected to another end of the second mounting arm 28b and opposite to the first fixing portion 28d. In addition, the first fixing portion 28d and the second fixing portion 28e are spaced by a gap 28f. The elastic portion 60 includes a pressing portion 60a and two engaging sections 64. The pressing portion 60a connects the two engaging sections 64 and corresponds to the gap 28f. The two engaging sections 64 respectively correspond to the first fixing portion 28d and the second fixing portion 28e. Accordingly, during the mounting member 28 being connected to the second engaging member 26b, the pressing portion 60a passes through the gap 28f, and the two engaging sections 64 respectively engage with a wall of the first fixing portion 28d and a wall of the second fixing portion 28e.

It is noticed that when the elastic portion 60 is applied to a force (e.g., the pressing portion 60a of the elastic portion 60 is pressed) to be changed from the first state S1 to the second state S2 (as shown in FIG. 4), the second engaging member 26b is able to be disengaged from the mounting member 28 (as shown in FIG. 3). Specifically, when a user is going to detach the mounting member 28 from the second engaging member 26b, the user only has to press the elastic portion 60 to have the elastic portion 60 to be the second state S2 (as shown in FIG. 4) to allow the mounting member 28 to be moved along a direction opposite to the mounting direction D1 and to be disengaged from the second engaging member 26b (as shown in FIG. 3). It is noticed that, the process of mounting and detaching of the mounting member 28 and the first engaging member 26a and the process of mounting and detaching of the mounting member 28 and the second engaging member 26b are substantially the same. For simplification, no further illustration is provided.

Figure 6:
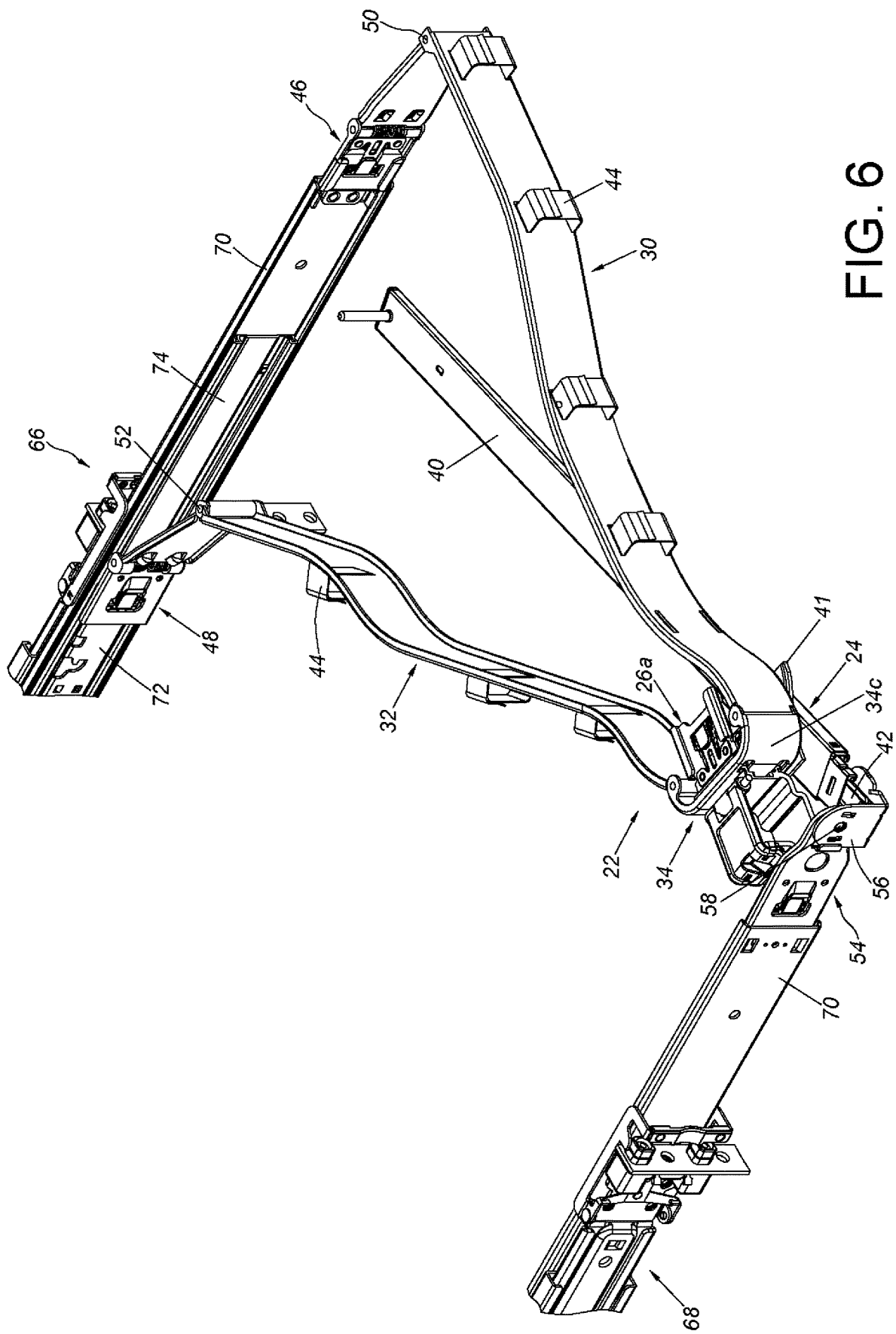
FIG. 6 is a schematic diagram illustrating the cable management assembly being applied to two slide rail assemblies according to an embodiment of the present invention.

As shown in FIG. 6, the cable management assembly is applicable to a first slide rail assembly 66 and a second slide rail assembly 68. The first slide rail assembly 66 and the second slide rail assembly respectively include a first rail 70 and a second rail 72 longitudinally movable relative to the first rail 70. Preferably, the first slide rail assembly 66 and the second slide rail assembly 68 further respectively include a third rail 74 movably mounted between the first rail 70 and the second rail 72. The third rail 74 is configured to extend a traveling distance of the second rail 72 relative to the first rail 70.

Furthermore, the first auxiliary member 46 is configured to mount the cable management device 22 to the first rail 70 of the first slide rail assembly 66. The second auxiliary member 48 is configured to mount the cable management device 22 to the second rail 72 of the first slide rail assembly 66. On the other hand, the third auxiliary member 54 is configured to mount the supporting device 24 to the first rail 70 of the second slide rail assembly 68. The mounting member 28 is detachably connected to the second engaging member 26b. Due to the angle of line of sight, the mounting member 28 and the second engaging member 26b are not shown in FIG. 6.

Figure 7:
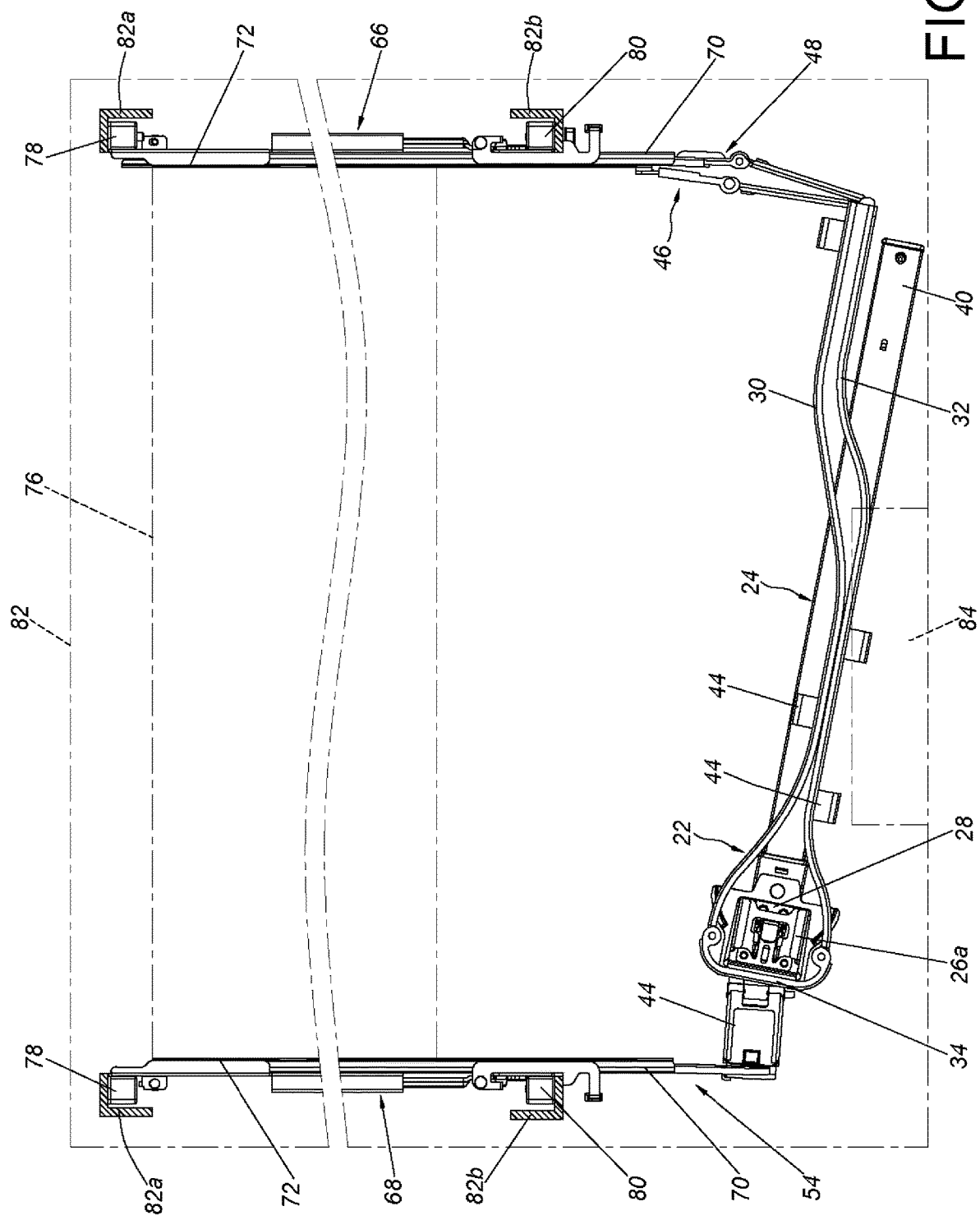
FIG. 7 is a diagram illustrating the cable management assembly being in a predetermined state and can be applied to two slide rail assemblies of a rack system according to an embodiment of the present invention.

As shown in FIG. 7, a front portion and a rear portion of the first rail 70 of the first slide rail assembly 66 and a front portion and a rear portion of the first rail 70 of the second slide rail assembly 68 are respectively mounted to a first post 82a and a second post 82b of a rack 82 (or a cabinet) through a first bracket 78 and a second bracket 80 respectively. Wherein, the second rail 72 of the first slide rail assembly 66 and the second rail 72 of the second slide rail assembly 68 carry a carried object 76 (such as an electronic apparatus). Furthermore, the cable management assembly is located behind the carried object 76. The cable management assembly is configured to manage cables (not shown in figures) behind the carried object 76 through the at least one cable management feature 44. Wherein, sometimes there is an environmental object 84 in the rack 82. Therefore, when the cable management assembly is in the second predetermined state, the supporting device 24 is connected to the first engaging member 26a through the mounting member 28 (the second engaging member 26b is omitted in FIG. 7). The supporting device 24 supports the bottom portion of the cable management device 22. Wherein, when the cable management assembly is in the second predetermined state, the cable management device 22 may be interfered with the environmental object 84 (due to the contour shape of first arm 30 and the contour shape of the second arm 32 are different). For example, the second arm 32 interferes with the environmental object 84.

Figure 8:
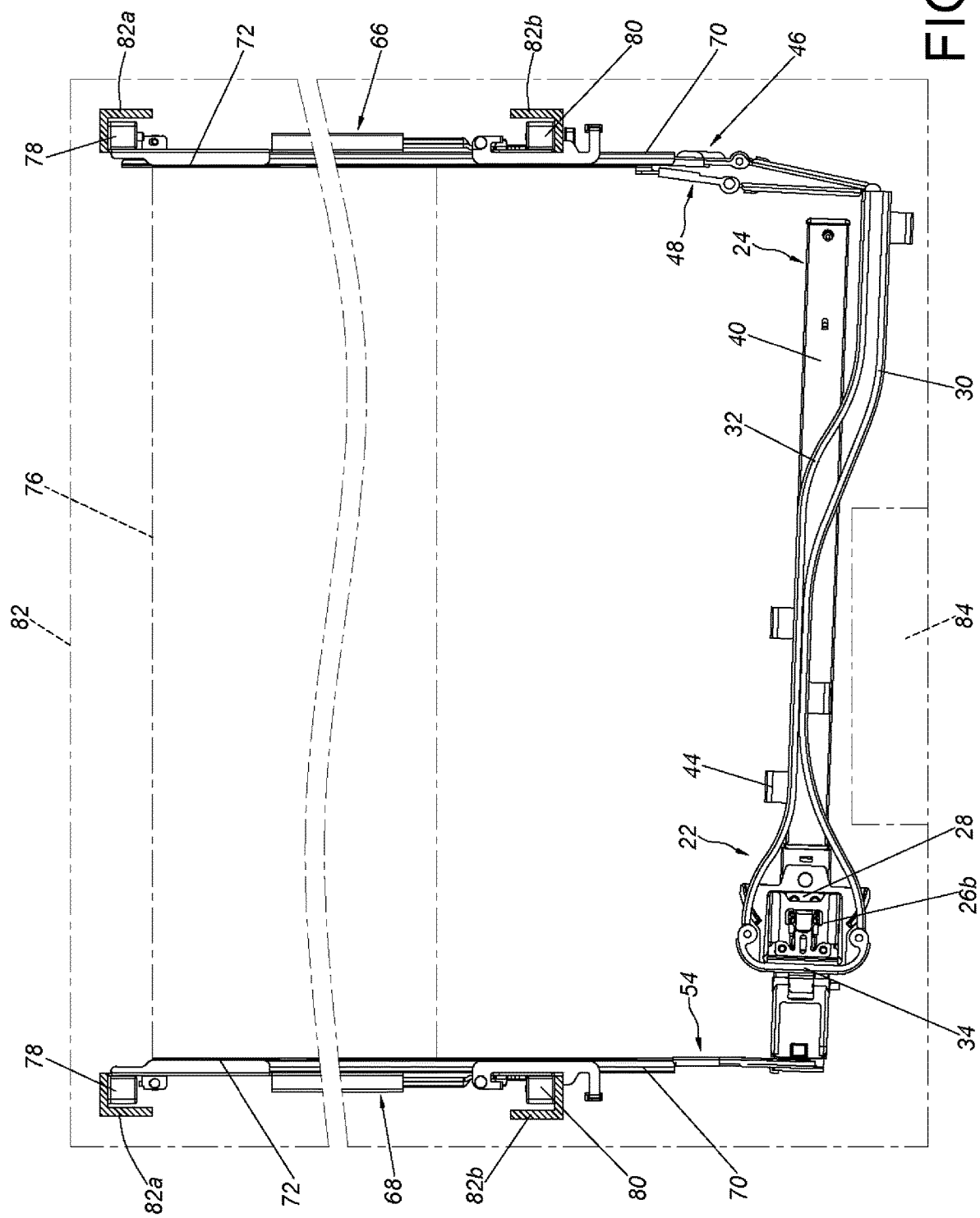
FIG. 8 is a diagram illustrating the cable management assembly being in another predetermined state and can be applied to the two slide rail assemblies of the rack system according to an embodiment of the present invention.

Compared to the positions of the first arm 30 and the second arm 32 of the cable management device 22 in FIG. 7, when the cable management device 22 is rotated 180 degrees (such as upside down), the positions of the first arm 30 and the second arm 32 are changed with the rotation (as shown in FIG. 8). The supporting device 24 is able to be connected to the second engaging member 26b (the first engaging member 26a is omitted in FIG. 8) through the mounting member 28. The supporting device 24 supports the bottom portion of the cable management device 22. Wherein, when the cable management assembly is in the first predetermined state, the cable management device 22 does not interfere with the environmental object 84 through the first arm 30.

Figure 9:
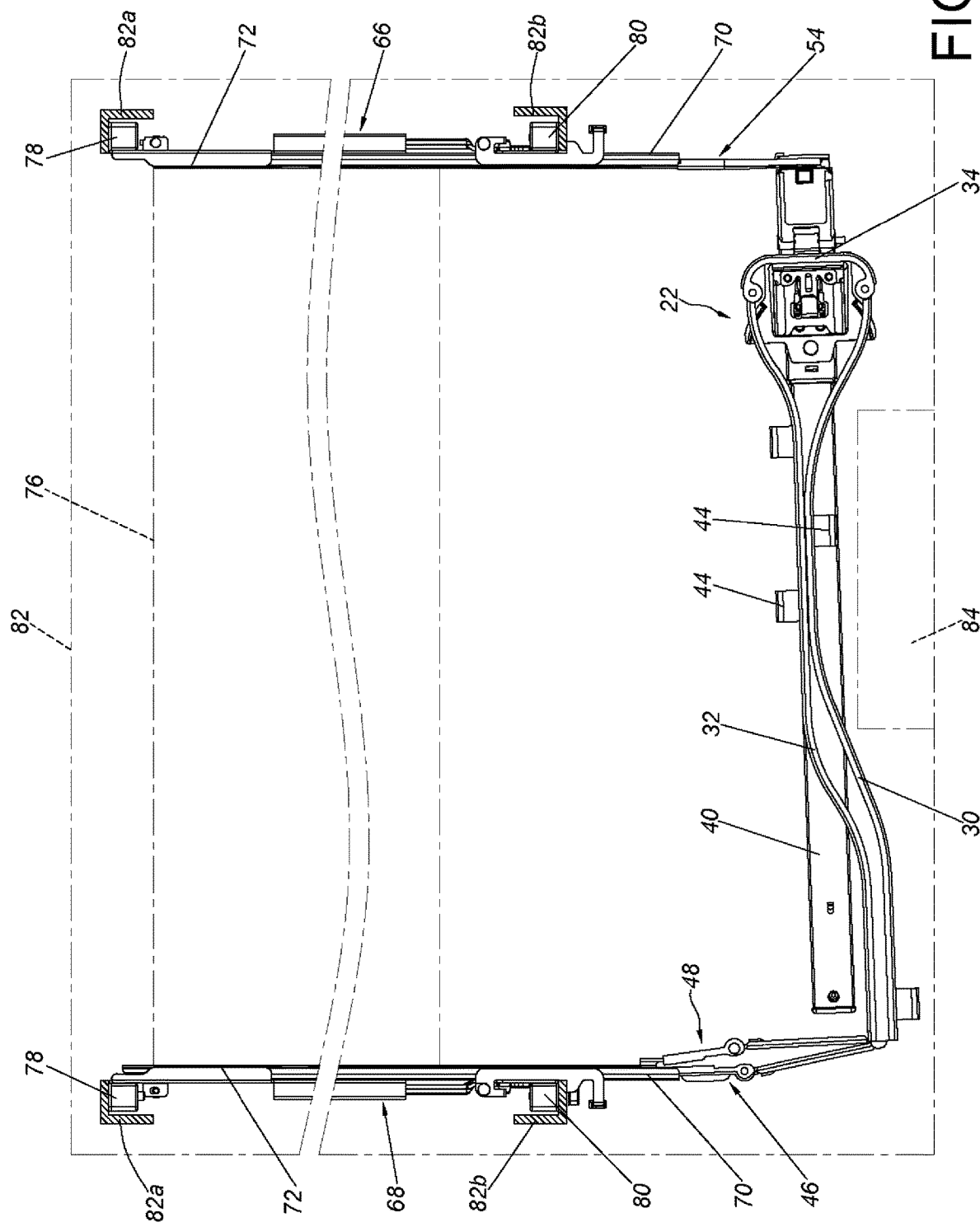
FIG. 9 is a diagram illustrating the cable management assembly being in yet another predetermined state and can be applied to the two slide rail assemblies of the rack system according to an embodiment of the present invention.

As shown in FIG. 9, the left position and the right position of the cable management assembly can also be interchanged (compared to the implementation type in FIG. 7). For example, when the left and right position of the cable management assembly is changed, the first auxiliary member 46 can be configured to mount the cable management device 22 to the second rail 70 of the second slide rail assembly 68, the second auxiliary member 48 can be configured to mount the cable management device 22 to the second rail 72 of the second slide rail assembly 68. On the other hand, the third auxiliary member 54 is configured to mount the supporting device 24 to the first rail 70 of the first slide rail assembly 66. According to requirement of environment, the left and right position of the cable management assembly can be interchanged, such that the cable management device 22 does not interfere with the environmental object 84 through the first arm 30.

Compared to the prior art, the cable management assembly of the present embodiment has advantages over the prior art by the following perspectives:

1. Through the mounting member 28 being detachably connected to the first engaging member 26a or the second engaging member 26b, the cable management device 22 and the supporting device 24 are able to be mounted on each other. According to the above arrangement, a predetermined state of the cable management assembly can be chosen from at least two predetermined states to meet environmental requirement (such as two predetermined states in FIG. 7 and FIG. 8), for improving the utilizable efficiency.

2. Through the first auxiliary member 46, the second auxiliary member 48 and third auxiliary member 54 being rotatable, the left and right position of the cable management assembly can be interchanged to be alternatively mounted on the rail of the first slide rail assembly or the rail of the second slide rail assembly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management assembly, comprising:
a cable management device; and
a supporting device detachably connected to the cable management device;
wherein one of the cable management device and the supporting device comprises two engaging members, the other one of the cable management device and the supporting device comprises a mounting member, the mounting member is configured to be detachably connected to one of the two engaging members;
wherein one of the two engaging members and the mounting member are engaged with each other through an elastic portion being in a first state.

2. The cable management assembly of claim 1, wherein when the elastic portion is applied to a force to be changed from the first state to a second state, the mounting member is able to be disengaged from one of the two engaging members.

3. The cable management assembly of claim 1, wherein the cable management device comprises a first arm, a second arm and a connecting member, the connecting member comprises a first connecting portion and a second connecting portion, the first connecting portion and the second connecting portion are configured to be respectively movably mounted on a first end portion of the first arm and a first end portion of the second arm.

4. The cable management assembly of claim 3, wherein the first connecting portion and the second connecting portion of the connecting member are respectively pivoted to the first end portion of the first arm and the first end portion of the second arm.

5. The cable management assembly of claim 3, wherein the connecting member of the cable management device further comprises an intermediate portion located between the first connecting portion and the second connecting portion, the two engaging members are respectively arranged on two positions of the intermediate portion.

6. The cable management assembly of claim 5, wherein the supporting device comprises at least one supporting rod, the mounting member is arranged on the at least one supporting rod.

7. The cable management assembly of claim 3, wherein at least one cable management feature is arranged on one of the first arm, the second arm and the connecting member.

8. The cable management assembly of claim 7, wherein a contour shape of the first arm and a contour shape of the second arm are different.

9. The cable management assembly of claim 6, wherein a first auxiliary member and a second auxiliary member are respectively arranged on a second end portion of the first arm and a second end portion of the second arm, the first auxiliary member and the second auxiliary member are configured to respectively mount the cable management device to a first object and a second object.

10. The cable management assembly of claim 9, wherein the first auxiliary member and the second auxiliary member are respectively pivoted to the second end portion of the first arm and the second end portion of the second arm.

11. The cable management assembly of claim 9, wherein the mounting member is arranged on the at least one supporting rod, a third auxiliary member is arranged adjacent to an end portion of the at least one supporting rod, the third auxiliary member is configured to mount the supporting device to a third object.

12. The cable management assembly of claim 11, wherein the third auxiliary member is pivoted to the end portion of the at least one supporting rod.

13. A cable management assembly applicable to a first slide rail assembly and a second slide rail assembly, the first slide rail assembly and the second slide rail assembly respectively comprising a first rail and a second rail movable relative to the first rail, the cable management assembly comprising:
a cable management device comprising a first arm, a second arm and a connecting member, wherein the first arm and the second arm respectively have a first end portion and a second end portion, the connecting member comprising a first connecting portion and a second connecting portion, the first connecting portion and the second connecting portion are respectively pivoted to a first end portion of the first arm and a first end portion of the second arm;
a first auxiliary member and a second auxiliary member respectively arranged on a second end portion of the first arm and a second end portion of the second arm, the first auxiliary member and the second auxiliary member are configured to respectively mount the cable management device to the first rail and the second rail of one of the first slide rail assembly and the second slide rail assembly;
a supporting device detachably connected to the cable management device, the supporting device comprising at least one supporting rod;
a third auxiliary member arranged on the at least one supporting rod, the third auxiliary member configured to mount the supporting device to the first rail of the other one of the first slide rail assembly and the second slide rail assembly;
two engaging members arranged on one of the cable management device and the supporting device; and
a mounting member arranged on the other one of the cable management device and the supporting device, the mounting member configured to be detachably connected to one of the two engaging members.

14. The cable management assembly of claim 13, wherein one of the two engaging members and the mounting member are engaged with each other through an elastic portion being in a first state, when the elastic portion is applied to a force to be changed from the first state to a second state, the mounting member is able to be disengaged from one of the two engaging members.

15. The cable management assembly of claim 13, wherein the two engaging members are respectively arranged on an upper position and a lower position of the connecting member of the cable management device.

16. The cable management assembly of claim 15, wherein the mounting member is arranged on the at least one supporting rod.

17. The cable management assembly of claim 13, wherein the first auxiliary member and the second auxiliary member are respectively pivoted to the second end portion of the first arm and the second end portion of the second arm.

18. The cable management assembly of claim 13, wherein the third auxiliary member is pivoted to an end portion of the at least one supporting rod.

* * * * *